(12) United States Patent
Bergemont et al.

(10) Patent No.: US 8,686,543 B2
(45) Date of Patent: Apr. 1, 2014

(54) 3D CHIP PACKAGE WITH SHIELDED STRUCTURES

(75) Inventors: Albert Bergemont, Palo Alto, CA (US); Uppili Sridhar, Cupertino, CA (US); Joseph Ellul, San Jose, CA (US); Yi-Sheng Anthony Sun, San Jose, CA (US); Elliott Simons, Southborough, MA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 67 days.

(21) Appl. No.: 13/284,116

(22) Filed: Oct. 28, 2011

(65) Prior Publication Data

US 2013/0105950 A1    May 2, 2013

(51) Int. Cl.
*H01L 23/58* (2006.01)
*H01L 21/50* (2006.01)

(52) U.S. Cl.
USPC ........................................................ 257/659

(58) Field of Classification Search
USPC ................... 257/659, 660, 684, 685
See application file for complete search history.

(56) References Cited

U.S. PATENT DOCUMENTS 5,998,868 A * 12/1999 Pogge et al. ................... 257/730
6,847,115 B2 * 1/2005 Crane et al. ................... 257/728
6,932,519 B2 * 8/2005 Steinberg et al. ............... 385/92
8,349,653 B2   1/2013 Parvarandeh
2006/0091293 A1 * 5/2006 Grueger et al. ............ 250/208.6

OTHER PUBLICATIONS

H. Sharifi and S. Mohammadi; Self-Aligned Wafer-Level Integration Technology with an Embedded Faraday Cage for Substrate Crosstalk Suppression; Microwave and Optical Technology Letters; vol. 50, No. 3, Mar. 2008; pp. 829-832.
U.S. Appl. No. 13/735,821, filed Jan. 7, 2013, entitled "Use of Device Assembly for a Generalization of Three-Dimensional Metal Interconnect Technologies".
U.S. Appl. No. 13/225,289, filed Sep. 2, 2011, entitled "Use of Device Assembly for a Generalization of Three-Dimensional Heterogeneous Technologies Integration".

* cited by examiner

*Primary Examiner* — Matthew W Such
*Assistant Examiner* — Robert Carpenter
(74) *Attorney, Agent, or Firm* — Advent, LLP

(57) ABSTRACT

A 3D chip package is disclosed that includes a carrier substrate with a first cavity and a second cavity formed therein. A first structure is attached to the carrier substrate at least partially in the first cavity, and a second structure is attached to the carrier substrate at least partially in the second cavity, where the first and second structures include electrical circuitry. A shield layer may be disposed between the carrier substrate and the first structure and/or the second structure for isolating the first structure and/or the second structure at least one of electrically, magnetically, optically, or thermally. In some embodiments, the shield layer may be a dielectric shield layer for dielectrically coupling the first structure and the second structure. The first structure and the second structure may be homogeneous or heterogeneous.

20 Claims, 3 Drawing Sheets

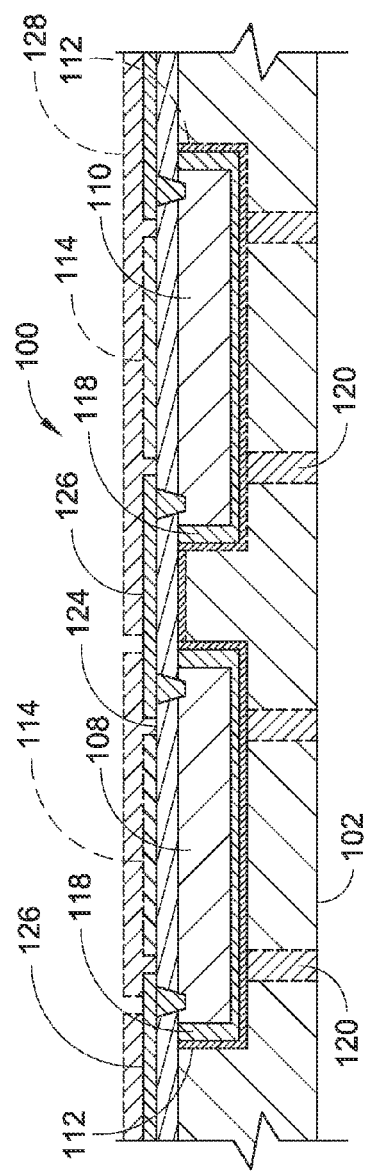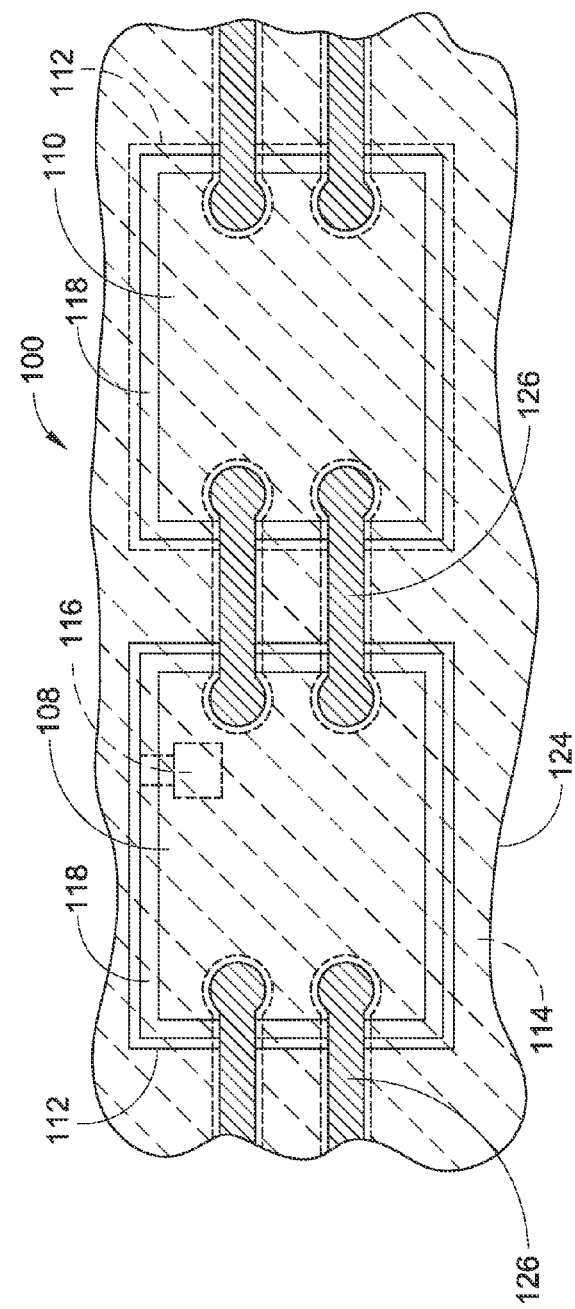

3D CHIP PACKAGE WITH SHIELDED STRUCTURES

BACKGROUND

A Three-Dimensional Integrated Circuit (3D IC) can be constructed using two or more layers of electronic components integrated into a single IC chip. These components may communicate using on-chip signaling, vertically and/or horizontally. A monolithic 3D IC may include electronic components and associated wiring built in layers on a single semiconductor wafer, which can then be diced into 3D ICs. A wafer-on-wafer 3D IC may include electronic components built on two or more semiconductor wafers, which can then be aligned, bonded, and diced into 3D ICs. Vertical connections can be built into the wafers before bonding and/or created in the stack after bonding. For example, Through-Silicon Vias (TSVs) can pass through silicon substrates between active layers and/or between an active layer and an external bond pad. A die-on-wafer 3D IC may include electronic components built on two semiconductor wafers. One wafer can be diced and the singulated dice can be aligned and bonded onto die sites of the second wafer. TSV creation can be performed before or after bonding. A die-on-die 3D IC may include electronic components built on multiple dice, which can then be aligned and bonded. TSV creation can be done before or after bonding.

SUMMARY

A 3D chip package that includes a carrier substrate with a first cavity and a second cavity formed therein is disclosed. A first structure (e.g., a die, an IC fabricated on a semiconductor wafer, a discrete electronic component, and so forth) is attached to the carrier substrate at least partially in the first cavity, and a second structure (e.g., a die, an IC fabricated on a semiconductor wafer, a discrete electronic component, and so forth) is attached to the carrier substrate at least partially in the second cavity, where the first and second structures include electrical circuitry. A shield layer may be disposed between the carrier substrate and the first structure and/or the second structure for isolating the first structure and/or the second structure at least one of electrically, magnetically, optically, or thermally. In some embodiments, the shield layer may be a dielectric shield layer for dielectrically coupling the first structure and the second structure. The first structure and the second structure may be homogeneous (e.g., both comprising digital circuitry or analog circuitry) or heterogeneous (e.g., one comprising digital circuitry and another comprising analog circuitry).

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The Detailed Description is described with reference to the accompanying figures. The use of the same reference numbers in different instances in the description and the figures may indicate similar or identical items.

FIG. 1 a diagrammatic cross-sectional side elevation view illustrating a 3D chip package including first and second IC structures attached to a carrier substrate, with a shield layer disposed between the carrier substrate and the first IC structure and/or the second IC structure in accordance with an example implementation of the present disclosure.

FIG. 2 is a top plan view of the 3D chip package illustrated in FIG. 1.

DETAILED DESCRIPTION

Overview

Figure 3:
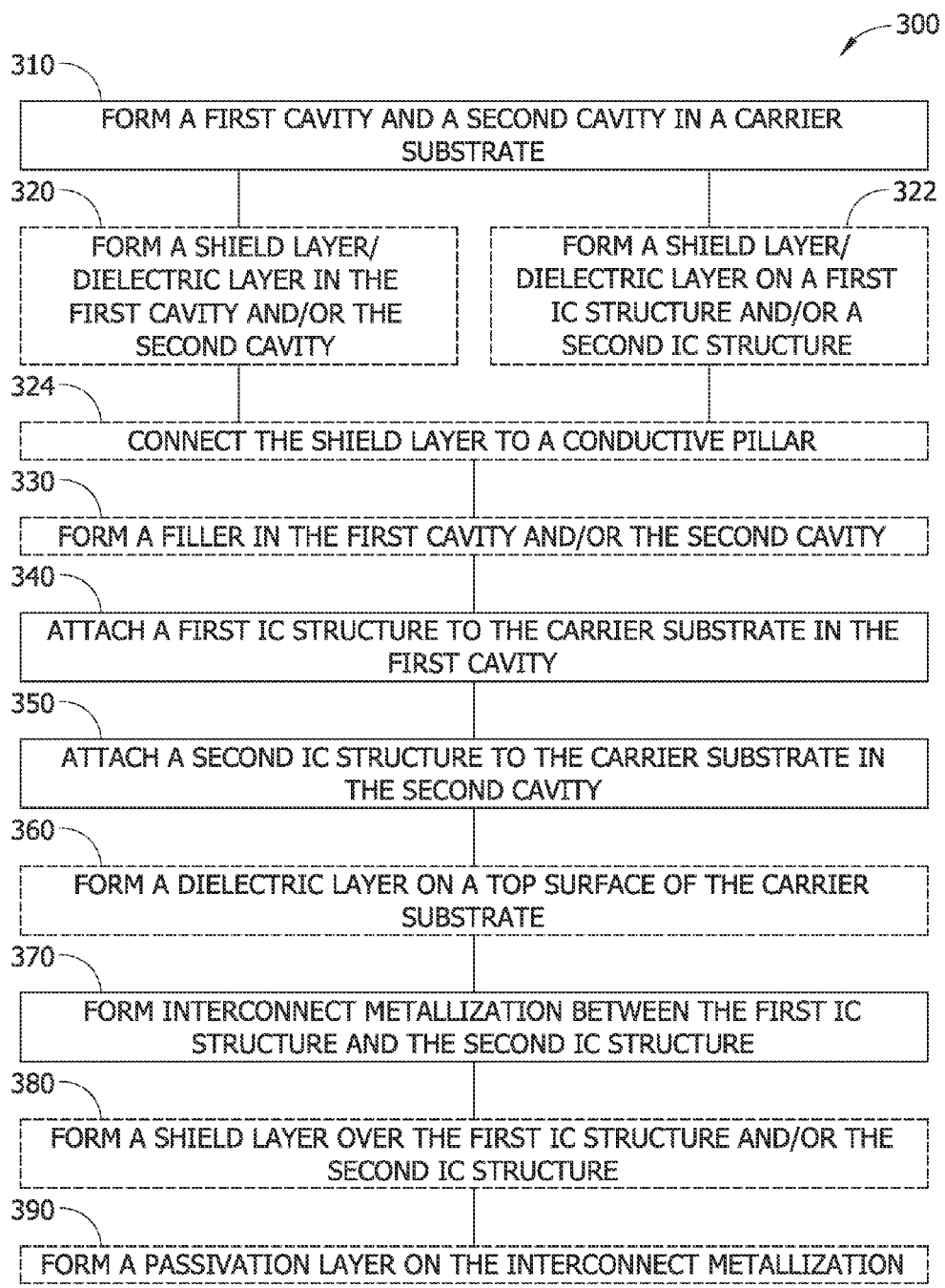
FIG. 3 is a flow diagram illustrating a method of forming a 3D chip package including first and second IC structures attached to a carrier substrate, with a shield layer disposed between the carrier substrate and the first IC structure and/or the second IC structure in accordance with the an example implementation of the present disclosure.

A 3D IC can be constructed using multiple layers of electronic components integrated into a single chip. However, when different components are packaged together, electrical and/or magnetic crosstalk may result. For example, fast switching digital ICs and high voltage switching ICs may generate electrical crosstalk. Similarly, high current switching ICs may generate magnetic crosstalk. Further, components of a 3D IC may be positioned closer in proximity to one another than similar components mounted on a Printed Circuit Board (PCB). For example, the components of a 3D IC may be separated by an average distance of between about two micrometers (2 μm) and five micrometers (5 μm), while components mounted on a PCB may be separated by an average distance of between about fifty micrometers (50 μm) and one hundred micrometers (100 μm). This close proximity can compound the electrical and/or magnetic crosstalk generated between components.

In a System on Chip (SoC) application, for example, a switching circuit may be co-packaged with a sensitive analog die and may generate substantial noise that can interfere with the functioning of the analog die. Noise may be coupled from the active circuits through substrate capacitance to an adjacent Radio Frequency (RF)/analog circuit, affecting its performance. Moreover, heavy current switching may cause magnetic coupling to adjacently packaged circuit wiring, causing unwanted currents, e.g., in a 3D IC configuration where a high current switching regulator circuit is packaged next to a sensitive high performance Analog to Digital (A/D) convertor or a sensor signal conditioning circuit.

Heat can also be transmitted from one component to another in a 3D IC implementation. Further, sensor components can be affected by undesirable signals received from nearby transmission components. For example, a light sensing component may receive undesired interference from an adjacent light transmitting component. In addition, signals from transmission circuitry on an IC component may be absorbed by an underlying substrate material, rather than directed outward from a 3D IC chip. The transmission of these signals through the substrate may cause undesired interference with components of the carrier substrate, as well as adjacent components mounted on the substrate.

To electrically separate 3D IC components from one another silicon interposers may be inserted between the components. These interposers may be covered with metallization, such as gold or aluminum, sputtered on the backsides of each interposer. The interposers may then be attached to a handling substrate upon which the various components are mounted. In this configuration, however, the metallization can only be provided on two sides of each die, and not between a die and the handling substrate. Thus, coupling and/or signal loss through the substrate may still occur.

Accordingly, three-dimensional (3D) chip packages are described that include two or more discrete IC structures attached to a common carrier substrate. The chip packages include one or more shield layers, with a shielded cavity lining disposed around one or more of the IC structures. The shielded cavity may provide electrical, magnetic, optical, and/or thermal shielding. For instance, a shielded cavity may be used to reduce or eliminate latchup between two diodes in adjacent IC structures. In this manner, a low-noise Complementary Metal-Oxide-Semiconductor (CMOS) die may be combined on a single chip with a die including high voltage industrial circuitry, and so forth. In implementations, 3D chip packages can be implemented as monolithic 3D ICs, wafer-on-wafer 3D ICs, die-on-wafer 3D ICs, or die-on-die 3D ICs.

A thick magnetic and/or electrical shielding layer surrounding the packaged circuits reduces or eliminates cross coupling. For example, electrically, a metal shield may act as a Faraday cage, which can be grounded. This shielding may furnish insulation for an electrical circuit that could otherwise act as an antenna, which may be subject to undesired effects from electromagnetic radiation. Further, this shielding may provide isolation from external magnetic fields, such as magnetic fields generated by the circuitry of nearby devices, the Earth's magnetic field, and so forth.

The semiconductor chip package can be used in applications where substrate coupling between ICs requires isolation, including power applications, Radio Frequency (RF) applications, digital applications, and sensitive analog die applications, including medical applications (e.g., ultrasonic ICs) and industrial applications (e.g., high power switching ICs). The semiconductor chip package can provide electrical and/or magnetic shielding of parts at various frequencies. For example, in an implementation with heterogeneously packaged structures, sensitive structures can be shielded from noisy switching structures. This shielding may be implemented with, for example, inductors, high current switching components, and so forth. Thus, the semiconductor chip package can achieve a very low parasitic interaction among assembled components.

The semiconductor chip package can also provide optical and/or thermal shielding between components. For instance, the shielding can reduce or eliminate the reception of undesired interference by a light sensing component from a light transmitting component. Further, the shielding can reduce or eliminate the absorption of optical signals by an underlying substrate material. For example, light from a Light Emitting Diode (LED) may be reflected by shielding between an IC structure and a carrier substrate, increasing the resulting signal-to-noise ratio of optical signals generated by the chip package. In another instance, the shielding may act as a heat sink for moving heat away from an IC structure and possibly for reducing or eliminating heat received by a nearby IC structure.

By providing shielded cavity integration to accommodate multiple IC structures in a single chip package, the desired functionality of a chip package may be furnished with, for example, multiple smaller dice rather than one larger, more complex die. This reduction in size may allow an increased yield when producing component die, which may reduce overall cost, process complexity, and so forth. Further, separate IC components can be optimized before being combined together in a 3D IC chip package and/or may be provided by different manufacturers having expertise with different technologies. For example, a bipolar transistor on one die may be optimized separately from a CMOS circuit on another die. Additionally, different IC components may be formed using different substrate materials (e.g., one IC structure may be formed on a silicon substrate, while another IC structure may be formed on a gallium nitride substrate, and so forth).

In some embodiments, the 3D chip package may include heterogeneous components (e.g., IC structures that differ in size, complexity, functionality, signal type, and so forth). For example, a 3D chip package may include one or more structures having digital circuitry and one or more structures having analog circuitry. In other embodiments, the 3D chip package may include homogeneous components (e.g., IC structures that are at least substantially similar in size, complexity, functionality, signal type, and so forth). For instance, a 3D chip package may include two or more structures with analog circuitry or two or more structures with digital circuitry.

As used herein, the terms "IC structure" and "structure comprising electrical circuitry" refer to electronic components having two or more electrical terminals/leads for connecting together to create an electrical circuit with a particular function. Examples of such structures include, but are not necessarily limited to: IC components, such as ICs built on semiconductor wafers, ICs built on semiconductor wafers that are subsequently singulated to produce a die, as well as discrete electronic components including, but not necessarily limited to: amplifiers, accelerometers, antennas, capacitors, diodes, filters, fuses, Liquid Crystal Diodes (LCDs), LEDs, organic LEDs (OLEDs), magnetic inductors, magnetometers, memristors, oscillators, photo resistors, radio receivers, resistors, sensors, switches, thermistors, transducers, transformers, transistors, waveguides, and so forth.

As used herein, the term "carrier substrate" refers to substrates constructed of semiconductor materials such as, but not necessarily limited to: silicon, silicon dioxide, aluminum oxide, sapphire, germanium, gallium arsenide (GaAs), alloys of silicon and germanium, and/or indium phosphide (InP). Further, for the purposes of the present disclosure, a carrier substrate can be formed as a semiconductor or an electrical insulator, and may include layers of both semiconducting and insulating material. For example, in implementations, a carrier substrate can be formed using an insulator, such as silicon oxide, with a layer of semiconducting material, such as silicon formed thereupon. Electrical components, such as transistors and diodes, can be fabricated in the semiconducting material. In other implementations, the carrier substrate can be formed as a dielectric. In implementations, the carrier substrate can be singulated from a semiconductor wafer. For example, the carrier substrate may be implemented as a die.

Example Implementations

FIGS. 1 and 2 illustrate example 3D chip packages, such as semiconductor chip package 100, having a carrier substrate 102 with a first cavity 104 and a second cavity 106 formed therein. A first IC structure (e.g., first die 108) is attached to the carrier substrate 102 at least partially in the first cavity 104 (i.e., disposed beneath a plane defined by a top surface of the carrier substrate 102, extending to a plane defined by a top surface of the carrier substrate 102, and/or extending beyond a plane defined by a top surface of the carrier substrate 102). A second IC structure (e.g., second die 110) is attached to the carrier substrate 102 at least partially in the second cavity 106.

A shield layer (e.g., first metal layer 112) is disposed between the carrier substrate 102 and the first IC structure and/or the second IC structure for at least substantially isolating the IC structures. For example, the first die 108 and/or the second die 110 may be isolated electrically, magnetically, optically, and/or thermally. The first metal layer 112 may be a dielectric shield layer for dielectrically coupling the first die 108 and the second die 110. In some embodiments, the semiconductor chip package 100 includes another shield layer (e.g., second metal layer 114) disposed over the first die 108 and/or the second die 110 for further isolating the IC structures.

One or more electrical and/or magnetic shield layers, such as first metal layer 112, may be deposited between the carrier substrate 102 and the first die 108 and/or the second die 110. In embodiments, the first metal layer 112 can be used to shield up to five sides of the first die 108 and/or the second die 110 adjacent to the carrier substrate 102. Further, one or more electrical and/or magnetic shield layers, such as second metal layer 114, may be deposited on top of the semiconductor chip package 100, over the first die 108 and/or the second die 110. The second metal layer 114 can surround, for example, metal lead-outs and/or interconnects between the various circuits of the first die 108 and/or the second die 110. In embodiments, the first metal layer 112 and the second metal layer 114 can be used to shield up to six sides of the first die 108 and/or the second die 110. This may be useful when additional devices are stacked on top of the first die 108 and/or the second die 110.

By forming metal shield layers on the semiconductor chip package 100 generally around the first die 108 and/or the second die 110, parasitic coupling of electrical and/or magnetic field to adjacent sensitive ICs may be suppressed. In embodiments, the first metal layer 112 and/or the second metal layer 114 can be formed from high conductivity metallization (e.g., gold, aluminum, and so forth), high magnetic permeability metallization, or metallization which may have both high conductivity and high magnetic permeability. In some instances, the first metal layer 112 and/or the second metal layer 114 can be grounded (i.e., connected to a ground of the semiconductor chip package 100, such as a ground plane, a ground pad 116, and so forth) to form a Faraday cage for electrical shielding. In other instances, the first metal layer 112 and/or the second metal layer 114 can be "floated" on the semiconductor chip package 100 (i.e., not directly connected to ground).

The first metal layer 112 and/or the second metal layer 114 can be formed from material including, but not necessarily limited to: metal films formed from: aluminum (Al), gold (Au), silver (Ag), Copper (Cu), or other high conductivity metals. In embodiments, the first metal layer 112 and/or the second metal layer 114 can be between about one micrometer and five micrometers (1 μm-5 μm) thick. Further, the metal layers may be patterned. In implementations where magnetic shielding is provided, the first metal layer 112 and/or the second metal layer 114 can be formed from a material having high permeability/"soft" magnetic properties (i.e., a material that can be magnetized but does not tend to stay magnetized), such as nickel-iron (e.g., $Ni_{80}Fe_{20}$), or a like metal.

In some configurations, the thickness of the first metal layer 112 and/or the second metal layer 114 may vary depending on frequency of operation, and may be about as thick as two times (2×) the magnetic skin depth at the maximum operating frequency, or some higher harmonic frequency where there is substantial voltage or current being generated in a digital or switching IC. For example, in some configurations, the metal thickness can range from between about two micrometers and ten micrometers (2 μm-10 μm). However, this range is provided by way of example only and is not meant to be restrictive of the present disclosure. Thus, other metal thicknesses may be utilized.

The first die 108 and/or the second die 110 may comprise one or more transmission components, such as a visible LED, an infrared LED, and so forth. Further, the first die 108 and/or the second die 110 may comprise one or more reception components, such as a light sensor (e.g., a visible light sensor, an infrared sensor, and so forth). In embodiments, the first die 108 and/or the second die 110 may comprise a waveguide. The semiconductor chip package 100 may include filler 118 positioned between the first die 108 and the first cavity 104 and/or between the second die 110 and the second cavity 106. The filler 118 may comprise a glue layer for planarizing the die to carrier substrate surface. In embodiments, the thickness of the filler 118 can be selected to fill the gap surrounding die and cavity and planarize the gap.

The first die 108 and/or the second die 110 may be isolated from the carrier substrate 102 and possibly from one another, as well as from external devices, electrical fields, magnetic fields, and so forth. For example, in embodiments, the first metal layer 112 can be configured as a heat sink for thermally isolating the first die 108 from the second die 110. Further, the first metal layer 112 can be connected to a conductive pillar 120 for conducting heat away from the IC structures. Additionally, the first metal layer 112 may comprise a reflective surface for preventing or reducing the penetration of light generated by an optical device into the carrier substrate 102. A reflective surface may reflect substantially all incident radiation or some portion thereof. As used herein, the term "reflective surface" refers to both reflective and semi-reflective surfaces, including surfaces configured to reflect radiation having one wavelength, while allowing radiation of another wavelength to penetrate the surface. For example, the first die 108 can include an LED. The first metal layer 112 may also prevent light from reaching the second die 110. For instance, the second die 110 can include a light sensor, which may otherwise receive interference from light generated by an LED included with the first die 108 when the two dice are placed in close proximity on the carrier substrate 102.

In embodiments, the first die 108 and/or the second die 110 can include a photodetector (e.g., a photodiode, a phototransistor, or another device configured to detect electromagnetic radiation in the visible light spectrum and/or the infrared light spectrum). In embodiments, a reflective surface formed with a shield layer between the carrier substrate 102 and the first die 108 and/or the second die 110 may comprise a filter, such as a blocking filter (e.g., an infrared blocking filter configured to reduce transmission of infrared light while passing visible light), a color pass filter (e.g., a color filter configured to filter visible light in a limited spectrum of wavelengths by blocking (e.g., absorbing or reflecting) visible light within one spectrum of wavelengths while allowing visible light in another spectrum of wavelengths to pass through the filter), an interference filter (e.g., an infrared cut interference filter configured to filter infrared light or a filter that allows visible light to pass in a specified range of wavelengths). In embodiments, a color pass filter may be formed using various deposition techniques, such as spin coating and/or photo patterning (e.g., for absorption filter formation). Likewise, suitable sputtering and plating techniques may be utilized for color interference filter formation. Further, a buffer layer may be formed over the surface of the carrier substrate 102 to encapsulate and provide protection to a color pass filter. A buffer layer may be comprised of a polymer material such as Benzocyclobutene (BCB) polymer, or the like. However, it is contemplated that other buffer material may be used.

Example Fabrication Process

The following discussion describes example techniques for fabricating a 3D chip package including a carrier substrate having two or more cavities formed therein, with IC structures attached to the carrier substrate at the cavities, and shielding between the carrier substrate and one or more of the IC structures. FIG. 3 depicts a process 300, in an example implementation, for fabricating a 3D chip package, such as the 3D chip package 100 illustrated in FIGS. 1 and 2 and described above.

Figure 4:
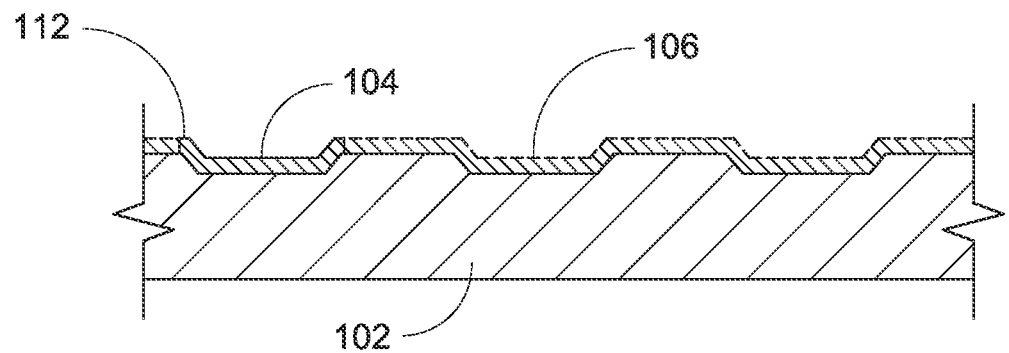
FIG. 4 is a diagrammatic cross-sectional side elevation view illustrating a carrier substrate including cavities plated with a shield layer in accordance with an example implementation of the present disclosure.

In the process 300 illustrated, a first cavity and a second cavity may be formed in a carrier substrate (Block 310). For example, with reference to FIG. 4, the first cavity 104 and the second cavity 106 may be formed in the carrier substrate 102 by wet etch (isotropic or anisotropic), dry etch, laser ablation, or other various techniques, including other ablation techniques, and so forth. In embodiments, the first cavity 104 and/or the second cavity 106 may be formed as square (e.g., as illustrated in FIG. 1) or trapezoidal (e.g., as illustrated in FIG. 4).

In some implementations, one or more shield layers and/or dielectric layers may then be formed in the first cavity and/or the second cavity (Block 320). For example, with continuing reference to FIG. 4, the first metal layer 112 may be deposited inside the first cavity 104 and/or the second cavity 106 using Physical Vapor Deposition (PVD), chemical vapor deposition, or other various plating techniques, such as electroplating and/or electroless plating. In some instances, a shield layer can be applied to the entirety of the carrier substrate 102 and then etched away to leave one or more portions of the shield layer, such as shield layers formed in the first cavity 104 and/or the second cavity 106. Further, the portions of the shield layer can be connected together by leaving a connecting portion of the shield layer between the first cavity 104 and the second cavity 106, such as for dielectric coupling, and so forth.

Figure 5:
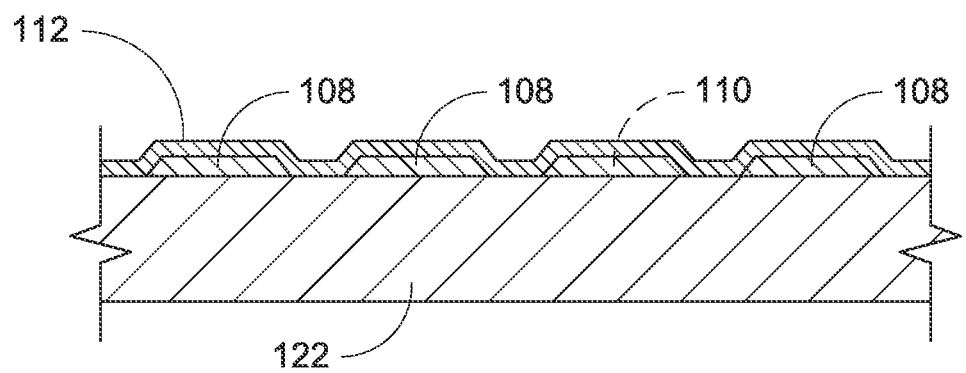
FIG. 5 is a diagrammatic cross-sectional side elevation view illustrating a number of IC structures attached to a carrier and plated with a shield layer in accordance with an example implementation of the present disclosure.

In other implementations, one or more shield layers may be formed on a first IC structure and/or a second IC structure (Block 322). For example, with reference to FIG. 5, the first metal layer 112 may be deposited (coated) on a back side of the first die 108 and/or the second die 110. In embodiments, the first die 108 and/or the second die 110 can be retained on a carrier 122 during the application of the first metal layer 112. In still further implementations, one or more shield layers may be formed in the first cavity and/or the second cavity and on the first IC structure and/or the second IC structure (Blocks 320 and 322). For example, with continuing reference to FIGS. 4 and 5, one first metal layer 112 may be deposited inside the first cavity 104 and another first metal layer 112 may be deposited (coated) on a back side of the first die 108. Further, one first metal layer 112 may be deposited inside the first cavity 104 and another first metal layer 112 may be deposited (coated) on a back side of the second die 110. In some implementations, one or more of the shield layers may be connected to one or more conductive pillars (Block 324). For example, with reference to FIGS. 1 and 2, the first metal layer 112 may be connected to a conductive pillar 120 extending into the carrier substrate 102 for conducting heat away from the first die 108 and/or the second die 110.

The conductive pillars 120 may be formed as fine pitch pillars comprising copper or another conductive material formed on the first die 108, the second die 110, and/or the carrier substrate 102. In embodiments, the pillars 120 can be formed with a dry film photo process. The dry film photo process may include forming a seed layer of a conductive material, such as copper, on the first die 108, the second die 110, and/or the carrier substrate 102. Then, a dry film may be laminated onto the seed layer. Next, a negative photoresist process may be used to photoexpose the shapes of the pillars 120 into the dry film and create holes to the seed layer. Then, the pillars 120 may be electroplated from the bottom up by depositing the conductive material in the holes in the dry film. It should be noted that the dry film photo process is provided by way of example only and is not meant to be restrictive of the present disclosure. Thus, pillars 120 may be formed using other fabrication techniques, conductive materials, and so forth.

A filler may next be formed in the first cavity and/or the second cavity (Block 330). For example, with continuing reference to FIGS. 1 and 2, filler 118 may be positioned between the first die 108 and the first cavity 104 and/or between the second die 110 and the second cavity 106. It should be noted that while the accompanying figures illustrate filler 118 positioned between the first die 108 and the first cavity 104 and between the second die 110 and the second cavity 106, in other implementations, a 3D chip package in accordance with the present disclosure may not include filler between an IC structure and its corresponding cavity. Thus, an IC structure may be in direct contact with a shield layer. Then, a first IC structure may be attached to the carrier substrate at least partially in the first cavity (Block 340). Next, a second IC structure may be attached to the carrier substrate at least partially in the second cavity (Block 350). For example, with continuing reference to FIGS. 1 and 2, the first die 108 and/or the second die 110 may be shaped by wet etch, dry etch, or by other various dicing techniques. Further, based upon die shaping, cavity etch techniques, and so forth, the first die 108 and the second die 110 can be assembled into the first cavity 104 and the second cavity 106 by pick and place tools with various degrees of positioning accuracy, self aligning techniques, self assembly techniques, and so forth.

A dielectric layer may then be formed on a top surface of the carrier substrate (Block 360). For example, with continuing reference to FIGS. 1 and 2, dielectric layer 124 may be deposited on the carrier substrate 102 over the first die 108 and the second die 110. Next, interconnect metallization may be formed between the first IC structure and the second IC structure to connect them together (Block 370). For example, with continuing reference to FIGS. 1 and 2, interconnect metallization 126 can be formed from the same material as first metal layer 112 and/or the second metal layer 114 and deposited on the first die 108 and/or the second die 110 to connect to the ICs included with the semiconductor chip package 100. In embodiments, connections to the first die 108 and/or the second die 110 can be furnished using wire bonding, solder bumps, and so forth. Then, one or more shield layers may be formed on the first IC structure and/or the second IC structure (Block 380). For example, with continuing reference to FIGS. 1 and 2, second metal layer 114 can be deposited on the semiconductor chip package 100. Next, a passivation layer may be formed on the interconnect metallization (Block 390). For example, with continuing reference to FIGS. 1 and 2, passivation layer 128 can be deposited on the semiconductor chip package 100.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A semiconductor device comprising:
   a carrier substrate defining a first cavity and a second cavity;
   a first structure attached to the carrier substrate at least partially in the first cavity, the first structure comprising electrical circuitry;
   a second structure attached to the carrier substrate at least partially in the second cavity, the second structure comprising electrical circuitry; and
   a filter disposed between the carrier substrate and at least one of the first structure or the second structure to provide filtering of light for the at least one of the first structure or the second structure, wherein the filter is configured to selectively reduce the transmission of light into the carrier substrate within a first spectrum of wavelengths and selectively allow light to pass into the carrier substrate within a second spectrum of wavelengths different from the first spectrum of wavelengths.

2. The semiconductor device as recited in claim 1, further comprising a shield layer disposed over at least one of the first structure or the second structure.

3. The semiconductor device as recited in claim 1, wherein the first structure and the second structure are homogeneous.

4. The semiconductor device as recited in claim 1, wherein the first structure and the second structure are heterogeneous.

5. The semiconductor device as recited in claim 1, wherein the first structure comprises a light emitting device and the second structure comprises a light sensing device.

6. The semiconductor device as recited in claim 1, wherein the filter comprises a blocking filter.

7. The semiconductor device as recited in claim 1, wherein the filter comprises a color pass filter.

8. The semiconductor device as recited in claim 7, further comprising a buffer layer at least partially encapsulating the color pass filter.

9. The semiconductor device as recited in claim 1, wherein the filter comprises an interference filter.

10. A method comprising:
    forming a first cavity and a second cavity in a carrier substrate;
    attaching a first structure to the carrier substrate at least partially in the first cavity, the first structure comprising electrical circuitry;
    attaching a second structure to the carrier substrate at least partially in the second cavity, the second structure comprising electrical circuitry; and
    forming a filter between the carrier substrate and at least one of the first structure or the second structure to provide filtering of light for the at least one of the first structure or the second structure, wherein the filter is configured to selectively reduce the transmission of light into the carrier substrate within a first spectrum of wavelengths and selectively allow light to pass into the carrier substrate within a second spectrum of wavelengths different from the first spectrum of wavelengths.

11. The method as recited in claim 10, further comprising forming a shield layer over at least one of the first structure or the second structure.

12. The method as recited in claim 10, wherein the first structure comprises a light emitting device and the second structure comprises a light sensing device.

13. The method as recited in claim 10, wherein the filter comprises a blocking filter.

14. The method as recited in claim 10, wherein forming a filter between the carrier substrate and at least one of the first structure or the second structure comprises at least one of spin coating or photo patterning the carrier substrate to form a color pass filter.

15. The method as recited in claim 14, further comprising at least partially encapsulating the color pass filter with a buffer layer.

16. The method as recited in claim 10, wherein the filter comprises an interference filter.

17. A semiconductor device comprising:
    a carrier substrate defining a first cavity and a second cavity;
    a first structure attached to the carrier substrate at least partially in the first cavity, the first structure comprising electrical circuitry;
    a second structure attached to the carrier substrate at least partially in the second cavity, the second structure comprising electrical circuitry;
    a filter disposed between the carrier substrate and at least one of the first structure or the second structure to provide filtering of light for the at least one of the first structure or the second structure; and
    a dielectric shield layer disposed between the carrier substrate and the first structure and the second structure for dielectrically coupling the first structure and the second structure.

18. The semiconductor device as recited in claim 17, further comprising a second shield layer disposed over at least one of the first structure or the second structure.

19. The semiconductor device as recited in claim 17, wherein the filter comprises at least one of a blocking filter, a color pass filter, or an interference filter.

20. The semiconductor device as recited in claim 19, further comprising a buffer layer at least partially encapsulating the at least one of the blocking filter, the color pass filter, or the interference filter.

* * * * *